(12) United States Patent
Byrne et al.

(10) Patent No.: US 8,072,360 B2
(45) Date of Patent: Dec. 6, 2011

(54) SIMULTANEOUS SAMPLING ANALOG TO DIGITAL CONVERTER

(75) Inventors: Eamonn Byrne, Limerick (IE); Paraic Brannick, Limerick (IE); Paul Kearney, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/645,807

(22) Filed: Dec. 23, 2009

(65) Prior Publication Data

US 2010/0283643 A1 Nov. 11, 2010

Related U.S. Application Data

(60) Provisional application No. 61/176,699, filed on May 8, 2009.

(51) Int. Cl.
*H03M 1/06* (2006.01)

(52) U.S. Cl. ........ 341/118; 341/120; 341/143; 341/155; 341/172

(58) Field of Classification Search .................. 341/118, 341/120, 122, 155, 172
See application file for complete search history.

(56) References Cited

U.S. PATENT DOCUMENTS

| | | | | |
|---|---|---|---|---|
| 5,638,072 | A * | 6/1997 | Van Auken et al. | 341/141 |
| 5,831,562 | A * | 11/1998 | Van Auken et al. | 341/122 |
| 6,313,779 | B1 * | 11/2001 | Leung et al. | 341/155 |
| 6,433,724 | B1 * | 8/2002 | Confalonieri et al. | 341/155 |
| 6,456,220 | B1 * | 9/2002 | Leung et al. | 341/155 |
| 6,674,386 | B2 * | 1/2004 | Carreau et al. | 341/155 |
| 6,828,927 | B1 * | 12/2004 | Hurrell et al. | 341/156 |
| 6,970,126 | B1 * | 11/2005 | O'Dowd et al. | 341/172 |
| 7,026,975 | B1 * | 4/2006 | Steward et al. | 341/161 |
| 7,233,273 | B2 * | 6/2007 | Tachibana et al. | 341/155 |
| 7,265,708 | B2 * | 9/2007 | Mitra et al. | 341/172 |
| 7,446,686 | B2 * | 11/2008 | Rueger et al. | 341/143 |
| 7,626,524 | B2 * | 12/2009 | Horie | 341/141 |
| 2009/0167587 | A1 * | 7/2009 | Xu et al. | 341/172 |
| 2010/0207791 | A1 * | 8/2010 | Ohnhaeuser et al. | 341/118 |

* cited by examiner

*Primary Examiner* — Linh Nguyen

(74) *Attorney, Agent, or Firm* — Kenyon & Kenyon LLP

(57) ABSTRACT

The invention is a novel scheme of performing an analog to digital conversion of simultaneous sampled analog inputs using multiple sample and hold circuits and a single successive approximation analog to digital converter ("SAR ADC"). Each of the analog inputs are stored on capacitors in the sample and hold circuits, and the sample and holds are sequentially connected to the capacitor DAC. After the digital conversion of the of the input signals stored on a sample and hold, the connected sample and hold is disconnected and the charge on the DAC is reset before the next sample and hold circuit is connected. The process is repeated until all analog inputs have been converted.

11 Claims, 5 Drawing Sheets

SIMULTANEOUS SAMPLING ANALOG TO DIGITAL CONVERTER

CROSS-REFERENCE TO RELATED APPLICATIONS

This application claims priority to U.S. Provisional Patent Application No. 61/176,699, filed on May 8, 2009, entitled "Simultaneous Sampling Analog to Digital Converter," which is herein incorporated by reference in its entirety.

FIELD OF INVENTION

The present invention relates to simultaneous sampling analog to digital converters. The present invention further relates to the method of simultaneously sampling multiple analog inputs using multiple sample and holds and converting to a digital representation using a single ADC.

BACKGROUND OF INVENTION

An analog to digital converter ("ADC") converts an analog signal into a digital representation of the analog signal. The ADC typically samples the analog signal at periodic intervals and generates a digital value for each sample indicating the approximate magnitude of the sampled analog signal.

One type of ADC uses a technique known as successive approximation ("SAR") to convert each analog input sample to a digital value. This type of ADC typically includes a digital to analog converter (DAC) and a single comparator to produce a digital value representing the magnitude of the analog input sample. The DAC is used to produce a reference voltage based upon a digital input value. The comparator is used to compare the DAC output to the analog input sample. The ADC converts an analog input sample to a digital value by successively changing the DAC output and comparing the DAC output to the analog input sample.

The DAC may consist of a binary weighted capacitor array. In an ideal DAC, each of the capacitors associated with a particular bit position is one-half the capacitance of the capacitor associated with the previous bit position, although such a configuration is not economically feasible to implement in practice.

It is sometimes necessary to sample multiple analog inputs simultaneously. This can be useful for maintaining the phase information of the analog inputs. Thus far previous inventions have attempted to sample N inputs using N ADCs. Accordingly, there is a need in the art for an efficient scheme for implementing N simultaneous sampling analog to digital converter using N sample and holds and a single ADC.

DETAILED DESCRIPTION

Embodiments of the present invention provide a multi-channel ADC having a plurality of sample and hold circuits, a single DAC, and a comparator. Each of the sample and hold circuits may store an input signal from one of the channels. The sample and hold circuits may be switched sequentially to the DAC, which converts the respective sampled input signal to a digital codeword by setting the MSB of the DAC and may use the comparator to compare the captured charge on the DAC to various voltage thresholds on a bitwise trial basis. This configuration may save area over previously available designs when the ADC is manufactured as an integrated circuit and may achieve a desired level of matching between channels.

Figure 1:
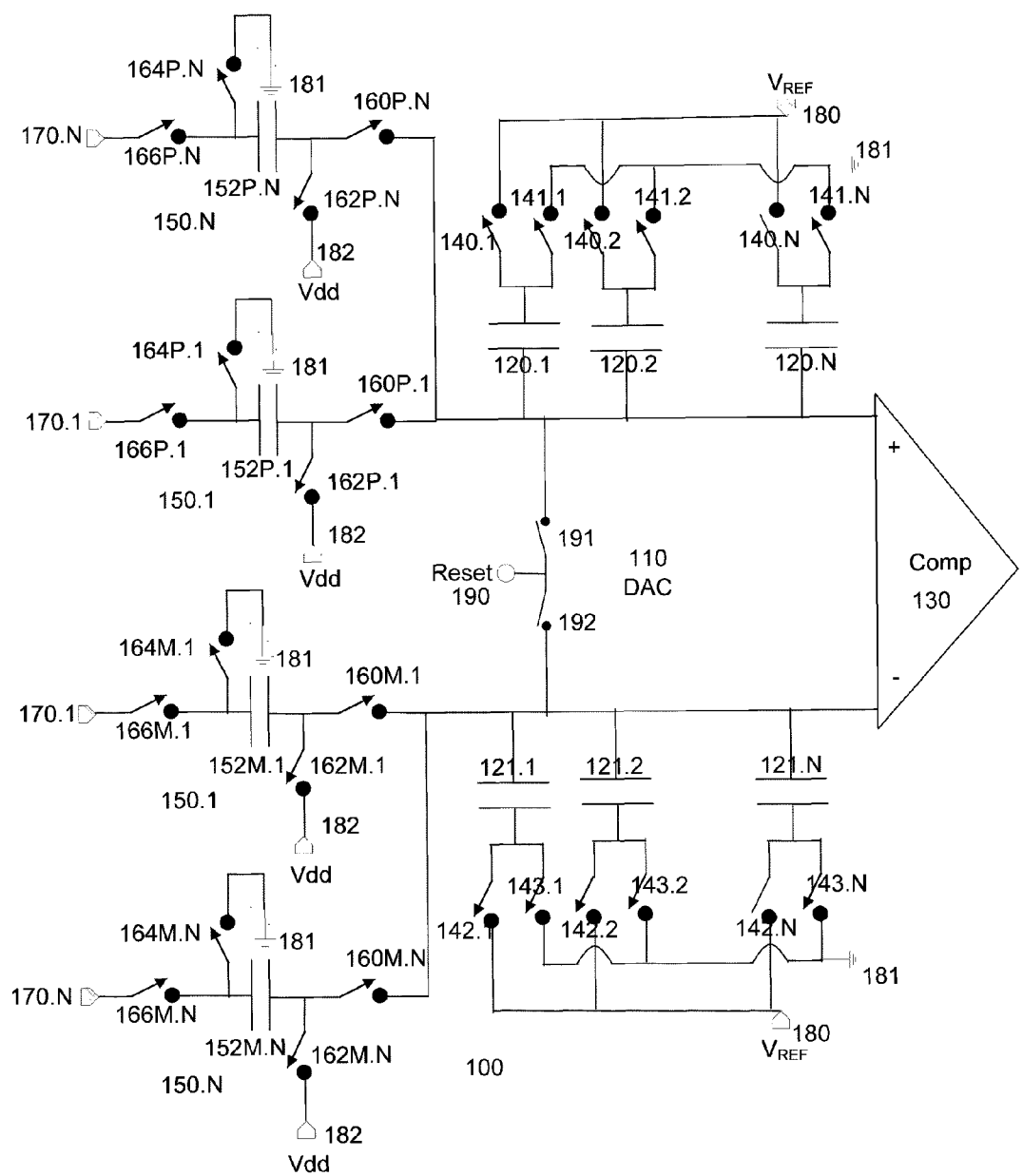
FIG. 1 is a circuit diagram of a differential ADC connected to a plurality of sample and hold circuits.

FIG. 1 illustrates a differential system in which each S&H 150.1-150.N may consist of a positive capacitor 152P and a negative capacitor 152M, each provided for a respective member of a pair of differential input signals 170.1-170.N, where the number of S&Hs implemented may be dependent on the number of inputs, N. In a differential system, DAC 110 may be provided with a pair of capacitor arrays 120, 121 each provided for a respective one of the pairs of input signals. Switches 160P, 160M may selectively connect the capacitors of each S&H circuit to the corresponding capacitor arrays 120, 121.

The ADC 100 may also include a comparator 130 that is connected to the pair of capacitor arrays 120, 121 at the comparator's input terminals. The positive input terminal of comparator 130 may be connected to capacitor array 120, and may also be connected to positive capacitor 152P via respective switch 160P. Capacitor array 121 may be connected to the negative input terminal of comparator 130, and the right-hand plates of the capacitor array may be connected at the same node to negative capacitor 152M via a respective switch 160M. In contrast to the right-hand plates of capacitors 152P, 152M being connected to DAC 110, the left-hand plates of capacitors 152P, 152M may be connected to ground 181. A capacitance mismatch between capacitors 152P, 152M and the capacitors in arrays 120, 121 may arise because conversion occurs on the capacitors in arrays 120, 121 and not on capacitors 152P, 152M in the S&H circuits, resulting in a gain error.

The right-hand plates of capacitors 120.1-120.N in capacitor array 120 may be alternately connected to a reference voltage 180 through switches 140.1-140.N and to ground 181 through switches 141.1-141.N. The right-hand plates of capacitors 121.1-121.N in capacitor array 121 may be connected to reference voltage 180 through switches 142.1-142.N and to ground 181 through switches 143.1-143.N. The value of reference voltage 180 is determined in accordance with the specifications of DAC 110. Capacitors arrays 120.1-120.N and 121.1-121.N may be binary weighted, and the capacitors may ideally differ by a factor of $2^N$. The present invention however, covers all configurations where the capacitor arrays may be binary weighted.

Figure 2:
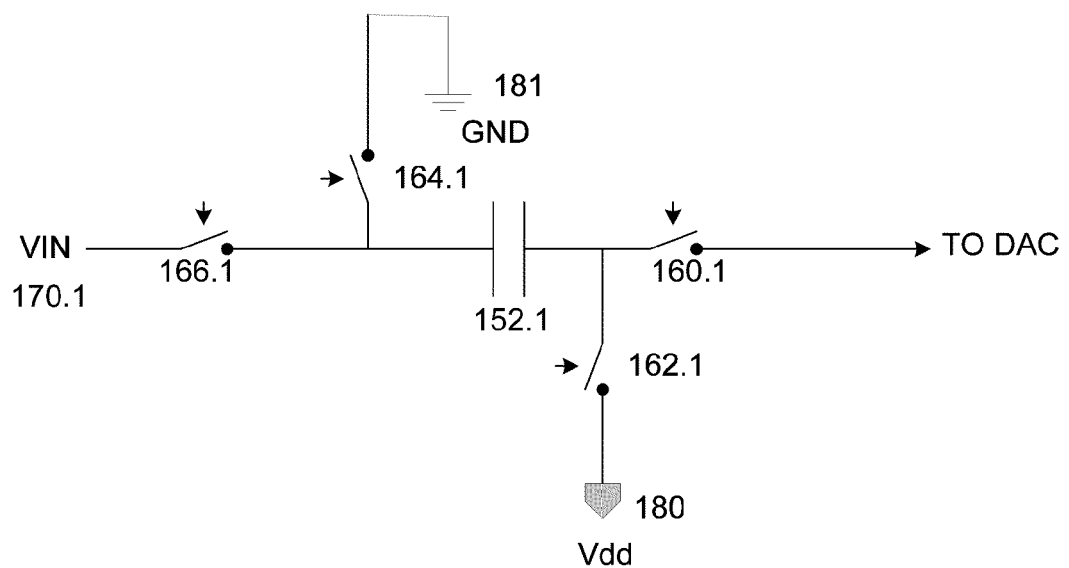
FIG. 2 is a circuit diagram of the switch arrangement in each of the sample and hold circuits in the differential ADC.

The right-hand plates of positive capacitor 152P may be connected to Vdd 182 through switch 162P.1-162P.N, while the left-hand plates of the capacitor may be alternately connected to ground 181 via switch 164P.1-164P.N, and to input signals 170.1-170.N through switch 166P.1-166P.N. The configuration of positive capacitor 152P is shown in greater detail in FIG. 2. Negative capacitor 152M may be oriented in the same manner depicted in FIG. 2. The right-hand plates of capacitor 152M.1-152M.N may be alternately connected to DAC 110 via switch 160M.1-160M.N and to Vdd 182 through switch 162M.1-162M.N. The left-hand plates of negative capacitor 152M may be alternately connected to ground 181 through switch 164M.1-164M.N, and to input signals 170.1-170.N via switch 166M.1-166M.N.

The DAC 110 may also contain a reset line 190. Reset line 190 may be configured between capacitor arrays 120, 121 and may be connected to the capacitor arrays through a set of switches 191, 192, shown in FIG. 1.

Figure 3:
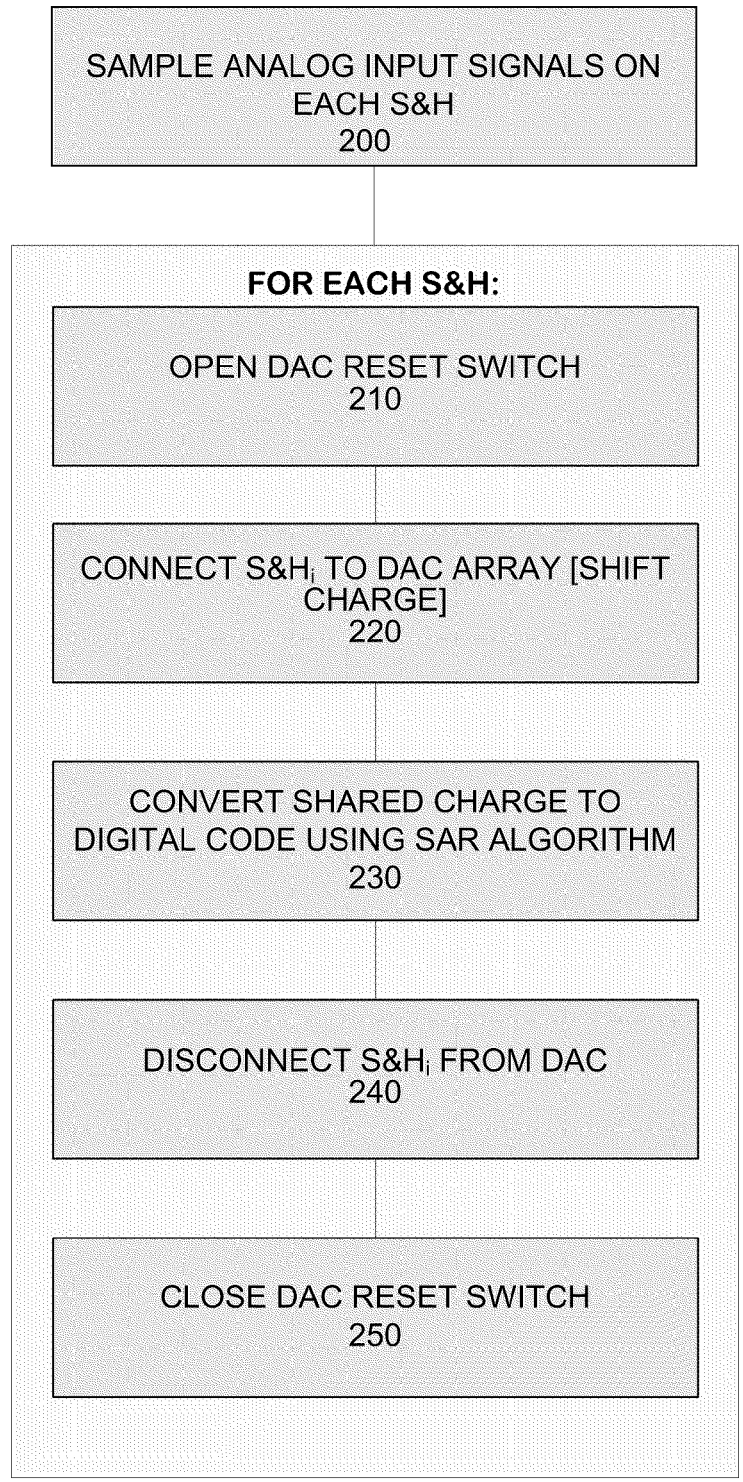
FIG. 3 is a diagram of the operation of the present invention.

The ADC 100 may operate according to two phases—a sampling phase and a conversion phase—which are further illustrated in FIG. 3. During sampling, N input signals may be applied to the S&H circuits 150.1-150.N from each of the input channels 170.1-170.N. Thus, the capacitors 152P, 152M of each S&H circuit 150.1-150.N may charge under influence of the input signals simultaneously. During the subsequent conversion, the sampled input signals may be applied sequentially to the DAC 110 for conversion to a digital control word.

During the sampling phase, switches 166P.1-166P.N, 166M.1-166M.N may be closed which connects the left-hand plates of the capacitors 152 to the analog inputs 170.1-170.N in step 200. Switches 162P.1-162P.N, 162M.1-162M.N may be closed to connect the right-hand plates of S&H capacitors 152 to Vdd 182. Switches 160P.1-160P.N, 160M.1-160M.N remain open as the S&H capacitors 152P, 152N remain disconnected from the DAC 110. Switches 162P.1-162P.N, 162M.1-162M may be opened which captures a charge equivalent to the input voltage on the S&H capacitors 152.

At the conclusion of the sampling phase, switches 166P.1-166P.N, 166M.1-166M may then be opened which disconnects the analog inputs 170 from the S&H capacitors 152.

During the conversion phase, the reset line 190 may be opened in step 210 and the switches 160P.1, 160M.1 of a first S&H 150.1 may be closed and connected to DAC 110 in step 220, whereupon sampled charge may be shared with capacitor arrays 120, 121. If the designer has selected the capacitance of capacitor arrays 120 and 121 to be the same as the capacitance of S&H capacitors 152, then the voltage at the positive input of the comparator 130 may be Vdd/2. Subsequently, the left-hand side plate of the first S&H capacitor 152P.1, 152M.1 may be connected to ground 181. The voltage at the positive input to the comparator may then decrease to Vdd/2−Vin/2.

Charge may be distributed in accordance to the binary weight of capacitors 120.1-120.N and 121.1-121.N in step 230, with each capacitor representing different bit positions. During the bitwise trial, iteration may be done through each of the bits in capacitor arrays 120, 121 starting at the most significant bit ("MSB") and progressing through until the least significant bit ("LSB") has been determined. Switches 140, 141, 142, and 143 may be set to test the various bit trail decisions. Comparator 130 may analyze and generate an output as to whether the input signal from capacitor array 120 is greater than the input signal from capacitor array 121. If the input signal from the positive capacitor array is greater than the input signal from the negative capacitor array, the 1 may be left in the bit position. If the input signal from the positive capacitor array is less than the input signal from the negative capacitor array, the bit position may be reset to 0.

At the conclusion of the bitwise test for the first sample, and once the digital codeword has been determined for the first input, S&H 150.1 may be disconnected from DAC 110 in step 240, and the DAC 110 may be reset in step 250 by closing reset line 190. Switches 160P, 160M of the next S&H may be closed and the bitwise conversion process, steps 210-250, may repeat. This process may be repeated until all input channels have been converted. In an embodiment of the invention, the SAR ADC is an 8 channel input device, and 8 analog inputs are simultaneously sampled using 8 S&H.

Figure 4:
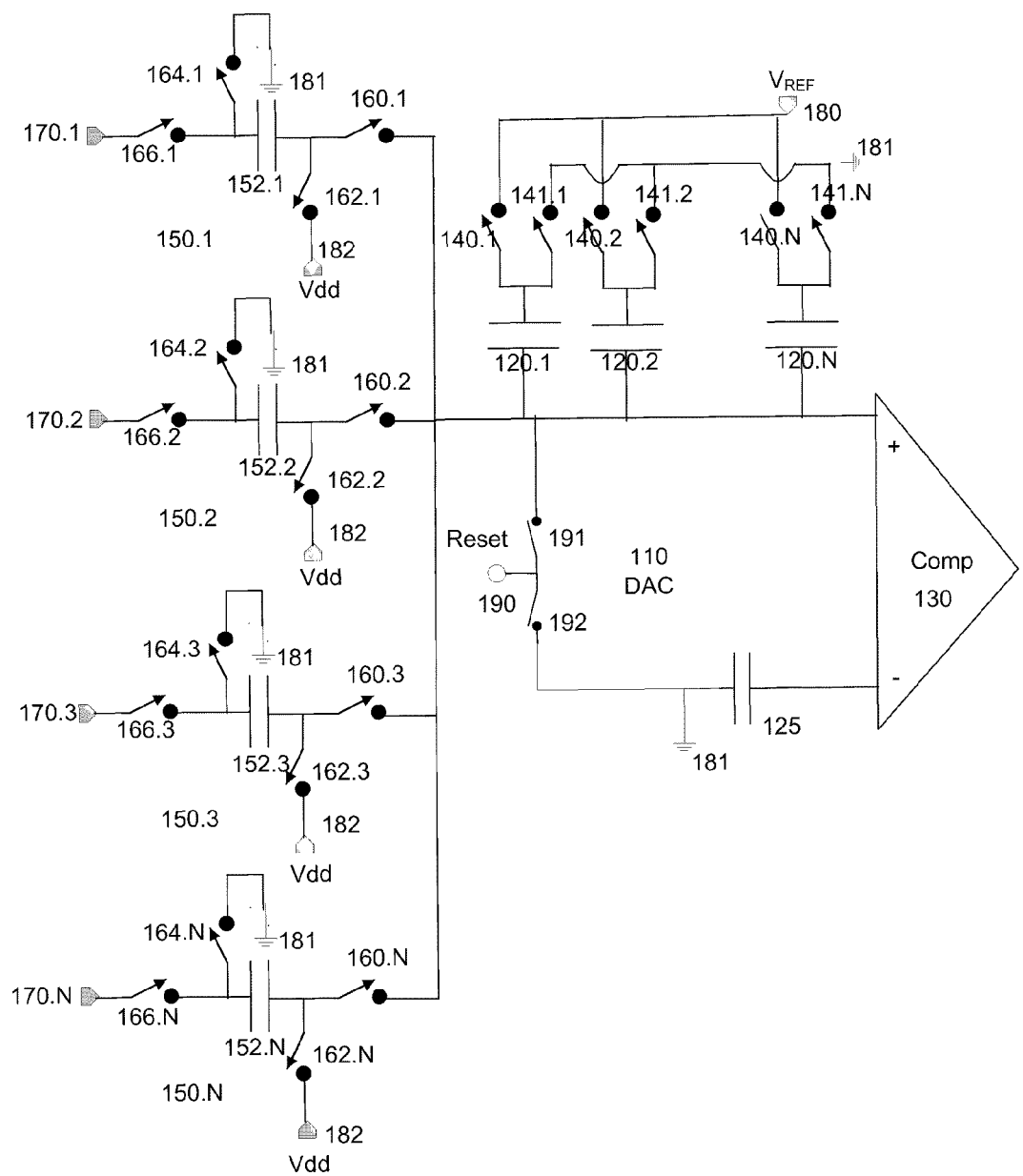
FIG. 4 is a circuit diagram of a single-ended ADC connected to a plurality of sample and hold circuits.

The system in the present invention may also be a single-ended system where multiple single-ended input signals are sampled as illustrated in FIG. 4. In a single-ended ADC, each of the S&H 150.1-150.N may simply consist of a single capacitor 152.1-152.N, provided for single input signal 170.1-170.N, where the number of S&Hs implemented may be dependent on the number of inputs, N. In a single-ended system, DAC 110 may consist of only a single capacitor array 120, connected to the input signal through switch 160.1-160.N.

A single-ended ADC 100 may also include a comparator 130 that is connected to capacitor array 120 at the positive input terminal of the comparator. The positive input terminal of comparator 130 may also be connected to the right-hand plate of capacitor 152 via a respective switch 160.1-160.N, with the left-hand plate of capacitor 152 alternately connected to ground 181 and analog input 170.1-170.N.

With the left-hand plates of capacitors 120.1-120.N in capacitor array 120 being connected to the input terminal of comparator 130, the right-hand plates of capacitors 120.1-120.N may alternately be connected to a reference voltage 180 through switches 140.1-140.N and to ground 181 through switches 141.1-141.N. In the single-ended ADC, a capacitor 125 is connected between the negative input terminal of comparator 130 and ground 181. The capacitance of capacitor 125 may match the capacitance of capacitor array 120. A reset line 190 may also be present in the single-ended ADC.

The single-ended ADC may also operate in both a sampling phase and a conversion phase. During sampling, N input signals may be applied to the S&H circuits 150.1-150.N from each of the input channels 170.1-170.N. Thus, the capacitor 152 of each S&H circuit 150.1-150.N may charge under the influence of the input signals simultaneously. Similarly to the differential system, during the conversion process, the sampled input signals may be applied sequentially to the DAC 110 for conversion to a digital control word. After conversion of the final channel, the ADC 100 is ready for another iteration of sampling and conversion.

Figure 5:
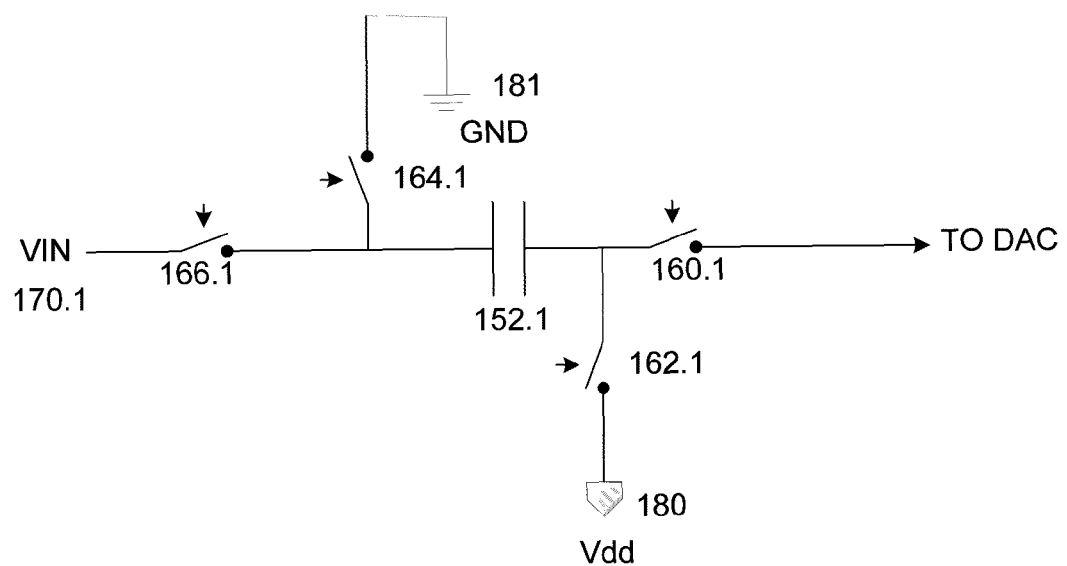
FIG. 5 is a circuit diagram of the switch arrangement in the single-ended ADC.

During the sampling phase in the single-ended system, capacitor 152.1-152.N may charge under influence of a respective input signal 170 after switch 166.1-166.N is closed, applying the analog input to the left-hand plates of the capacitors 152. Switch 160.1-160.N may remain open, electrically isolating the single S&H capacitor from DAC 110. The switching network in each S&H in a single-ended system is illustrated in FIG. 5. Switch 162 may also be closed, resulting in the application of Vdd 182 to the right-hand plate of capacitors 152.1-152.N while switch 164 may remain open, disconnecting the left-hand plates of capacitors 152 from ground 181.

During the conversion phase, switch 160.1 of a first S&H 150.1 may be closed and connected to DAC 110, which shares sampled charge with capacitor array 120 and the charge is distributed to the individual capacitors 120.1-120.N. Switch 162.1 may be opened and the right-hand plate of capacitor 152.1 may be disconnected from Vdd 182. During this transfer, switch 166.1 may also be opened and the left-hand plates of capacitor 152.1 may be disconnected from input signal 170.1. Alternately, switch 164.1 may be closed, connecting ground 181 to the left-hand plate of capacitor 152.1, resulting in the voltage Vdd/2−Vin/2, at the positive input to comparator 110.

Thereafter, DAC 110 may perform a bitwise test to convert the accumulated charge to a digital codeword. The manner in which the bitwise trial occurs is similar to the differential system, but in the single-ended system, the input signal may be compared to the output of capacitor 125. During the bitwise trial, iteration may be done through each of the bit positions in capacitor array 120 from the MSB to the LSB. Switches 140 and 141 may be set to test the bit decisions. The output of DAC 110 is sent to the positive input terminal of comparator 130. Comparator 130 may analyze and generate an output as to whether the input signal from DAC 110 is greater than the output voltage of capacitor 125 applied to its negative input terminal. If the input signal from DAC 110 is greater, the 1 may be left in the bit position. If the input signal from the capacitor array is less than the comparing voltage, the bit position may be reset to 0. The bitwise test may then progress to the next bit position and the process may be repeated for the remaining bit positions.

At the conclusion of the bitwise test for the first S&H, S&H 150.1 may be disconnected from DAC 110, and the DAC 110 may be reset via the reset line 190. Switch 160.2 of the next S&H may be closed and the bitwise conversion test may be repeated. This entire process may be repeated until all input channels have been converted.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A multi-channel analog to digital converter (ADC), comprising:
    at least one switched capacitor DAC;
    at least one comparator directly coupled to the switched capacitor DAC, wherein the at least one comparator compares a captured charge on the switched capacitor DAC to different voltage thresholds on a bitwise trial basis; and
    a plurality of sample and hold circuits, each of the sample and hold circuits to sample an input signal from a respective channel during a sampling phase, wherein each sample and hold circuit is directly connected to the switched capacitor DAC and the at least one comparator during a charge sharing phase.

2. The ADC according to claim 1, wherein each of the sample and hold circuits contains a pair of capacitors to sample a differential input signal.

3. The ADC according to claim 1, wherein each of the sample and hold circuits contains a single capacitor to sample a single-ended input signal.

4. The ADC according to claim 2, wherein each of the sample and hold circuits has a pair of switches that connects a left hand-side of the capacitor to an analog input.

5. The ADC according to claim 2, wherein each of the sample and hold circuits has a pair of switches that connects a left hand-side of the capacitor to a fixed DC input.

6. The ADC according to claim 2, wherein each of the sample and hold circuits has a pair of switches that connects a right hand-side of the capacitor to an analog input.

7. The ADC according to claim 2, wherein each of the sample and hold circuits has a pair of switches that connects a right hand-side of the capacitor to a fixed DC input.

8. The ADC according to claim 1, wherein the switched capacitor DAC is a differential switching array.

9. The ADC according to claim 1, wherein the switched capacitor DAC is a single ended switching array.

10. A method for converting a plurality of analog input signals to digital codes using a common switched capacitor DAC, the method comprising:
    a) sampling each of the analog signals on respective sample and hold circuits, the sample and hold circuits storing each of the analog input signals on at least one capacitor;
    b) sequentially converting each of the sampled input signals to a digital codeword by:
        (i) sharing a sampled input charge from the respective sample and hold circuit with the switched capacitor DAC by connecting the respective sample and hold circuit in parallel with the switched capacitor DAC,
        (ii) performing digital conversion of the shared input signal via the switched capacitor DAC and a comparator,
        (iii) comparing a captured charge on the switched capacitor DAC to different voltage thresholds on a bitwise trial basis with the comparator, and
        (iv) resetting the switched capacitor DAC and disconnecting the respective sample and hold circuit, wherein the sequential conversion performs sub-steps (i)-(iv) in order for each of the sample and hold circuits.

11. A method for converting a plurality of analog input signals to digital codes using a common switched capacitor DAC, the method comprising:
    a) sampling each of the analog signals on respective sample and hold circuits, the sample and hold circuits storing each of the analog input signals on at least one capacitor;
    b) sequentially converting each of the sampled input signals to a digital codeword by:
        (i) opening a reset line in the DAC;
        (ii) sharing a sampled input charge from the respective sample and hold circuit with the switched capacitor DAC by connecting the respective sample and hold circuit in parallel with the switched capacitor DAC,
        (iii) performing digital conversion of the shared input signal via the switched capacitor DAC and a comparator,
        (iv) comparing a captured charge on the switched capacitor DAC to different voltage thresholds on a bitwise trial basis with the comparator,
        (v) disconnecting the respective sample and hold circuit from the switched capacitor DAC,
        (vi) closing the reset line, and
        (vii) resetting the switched capacitor DAC, wherein the sequential conversion performs sub-steps (i)-(vii) in order for each of the sample and hold circuits.

* * * * *